(12) United States Patent
Sugiura

(10) Patent No.: US 9,176,210 B2
(45) Date of Patent: Nov. 3, 2015

(54) MAGNETIC RESONANCE IMAGING APPARATUS

(71) Applicants: KABUSHIKI KAISHA TOSHIBA, Tokyo (JP); TOSHIBA MEDICAL SYSTEMS CORPORATION, Otawara-shi, Tochigi-ken (JP)

(72) Inventor: Satoshi Sugiura, Otawara (JP)

(73) Assignees: KABUSHIKI KAISHA TOSHIBA, Tokyo (JP); TOSHIBA MEDICAL SYSTEMS CORPORATION, Otawara-Shi, Tochigi (JP)

( * ) Notice: Subject to any disclaimer, the term of this patent is extended or adjusted under 35 U.S.C. 154(b) by 537 days.

(21) Appl. No.: 13/684,739

(22) Filed: Nov. 26, 2012

(65) Prior Publication Data

US 2013/0134976 A1    May 30, 2013

(30) Foreign Application Priority Data

Nov. 25, 2011 (JP) ................... 2011-258299
Oct. 11, 2012 (JP) ................... 2012-225843

(51) Int. Cl.
  *G01V 3/00* (2006.01)
  *G01R 33/54* (2006.01)
  *G01R 33/565* (2006.01)
  *G01R 33/567* (2006.01)

(52) U.S. Cl.
  CPC ........ *G01R 33/543* (2013.01); *G01R 33/56509* (2013.01); *G01R 33/5673* (2013.01); *G01R 33/5676* (2013.01)

(58) Field of Classification Search
  CPC ...................................................... G01R 33/543
  USPC ......................................................... 324/314
  See application file for complete search history.

(56) References Cited

U.S. PATENT DOCUMENTS

| 6,144,874 | A | 11/2000 | Du | |
| 2005/0165295 | A1* | 7/2005 | Li et al. | 600/410 |
| 2011/0152669 | A1* | 6/2011 | Kassai | 600/413 |
| 2013/0251225 | A1* | 9/2013 | Liu et al. | 382/131 |
| 2013/0272591 | A1* | 10/2013 | Xue et al. | 382/131 |
| 2015/0035531 | A1* | 2/2015 | Stemmer | 324/309 |
| 2015/0115956 | A1* | 4/2015 | Ackerman et al. | 324/309 |

OTHER PUBLICATIONS

Takahashi, et al., "Non-Contrast-Enhanced Renal MRA Using Time-Spatial Labeling Pulse (t-SLIP) with 3D Balanced SSFP," *Book of Abstract 15th Annual Meeting, ISMRM 2007*, p. 179.

(Continued)

*Primary Examiner* — Rodney Fuller
(74) *Attorney, Agent, or Firm* — Nixon & Vanderhye P.C.

(57) ABSTRACT

A magnetic resonance imaging apparatus according to embodiments includes an executing unit, an informing unit, a detecting unit, and a determining unit. The executing unit executes a pulse sequence to collect data of a subject at a constant cycle. The informing unit informs the subject of a timing of breathing in synchronization with the cycle at which the pulse sequence is executed. The detecting unit detects a breathing level or a respiratory cycle of the subject. The determining unit determines, when the pulse sequence is executed, whether to use the data collected by the pulse sequence for image reconstruction in accordance with the breathing level or the respiratory cycle of the subject.

20 Claims, 8 Drawing Sheets

(56) References Cited

OTHER PUBLICATIONS

Parienty, et al., "Renal Artery Stenosis Evaluation in Chronic Kidney Disease," *Radiology*, vol. 259, No. 2 (2011) pp. 592-601.

Wang, et al., "Navigator-Echo-based Real-Time Respiratory Gating and Triggering for Reduction of Respiration Effects in Three-Dimensional Coronary MR Angiography," *Radiology* (1996) 198, pp. 55-60.

* cited by examiner

MAGNETIC RESONANCE IMAGING APPARATUS

CROSS-REFERENCE TO RELATED APPLICATIONS

This application is based upon and claims the benefit of priority from Japanese Patent Application No. 2011-258299, filed on Nov. 25, 2011; and Japanese Patent Application No. 2012-225843, filed on Oct. 11, 2012, the entire contents of all of which are incorporated herein by reference.

FIELD

Embodiments described herein generally relate to a magnetic resonance imaging apparatus.

BACKGROUND

As a conventional imaging method to prevent deterioration of image quality by breathing in a magnetic resonance imaging apparatus, known is breathing-synchronous imaging in which imaging is performed in synchronization with the breathing of a subject. Furthermore, to keep a respiratory cycle constant in such breathing-synchronous imaging, known is a method that informs the subject of the timing of breathing by a guiding voice during imaging.

DETAILED DESCRIPTION

A magnetic resonance imaging apparatus according to embodiments includes an executing unit, an informing unit, a detecting unit, and a determining unit. The executing unit executes a pulse sequence to collect data of a subject at a constant cycle. The informing unit informs the subject of the timing of breathing in synchronization with the cycle at which the pulse sequence is executed. The detecting unit detects a breathing level or a respiratory cycle of the subject. The determining unit determines, when the pulse sequence is executed, whether to use the data collected by the pulse sequence for image reconstruction in accordance with the breathing level or the respiratory cycle of the subject.

With reference to the accompanying drawings, the magnetic resonance imaging apparatus in the embodiments will be described hereinafter.

First Embodiment

Figure 1:
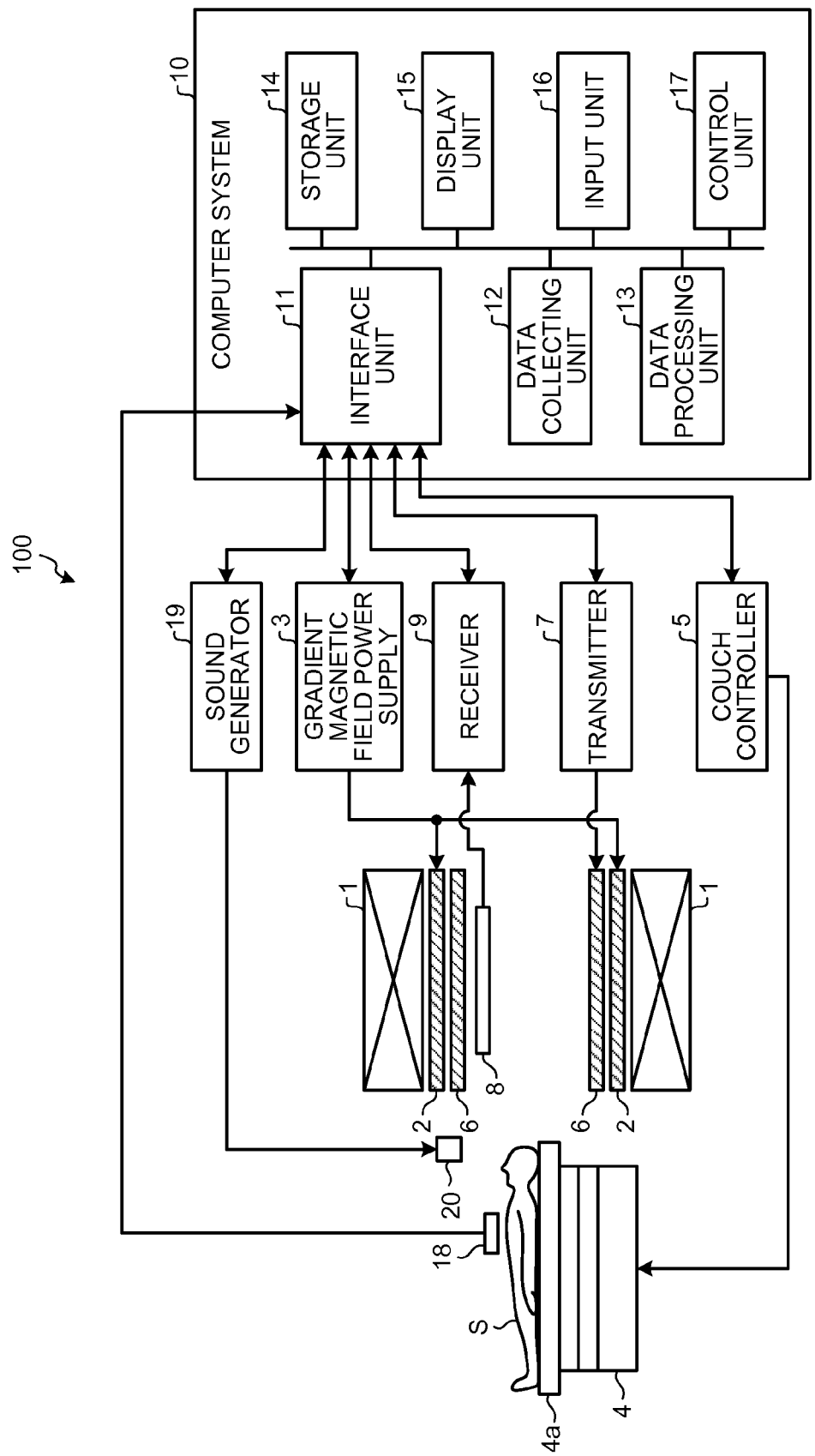
FIG. 1 is a block diagram illustrating a configuration of a magnetic resonance imaging apparatus according to a first embodiment.

The configuration of a magnetic resonance imaging apparatus according to a first embodiment will be described first. FIG. 1 is a block diagram illustrating the configuration of the magnetic resonance imaging apparatus in the first embodiment. As illustrated in FIG. 1, a magnetic resonance imaging apparatus 100 in the first embodiment includes a static magnetic field magnet 1, a gradient coil 2, a gradient magnetic field power supply 3, a couch 4, a couch control unit 5, a transmitting RF coil 6, a transmitter 7, a receiving RF coil 8, a receiver 9, and a computer system 10.

The static magnetic field magnet 1 is a magnet formed in a hollow cylindrical shape, and generates a uniform static magnetic field in a space therein. As the static magnetic field magnet 1, for example, a permanent magnet or a superconducting magnet is used.

The gradient coil 2 is a coil formed in a hollow cylindrical shape and is disposed on an inner side of the static magnetic field magnet 1. The gradient coil 2 is formed in combination with three coils corresponding to each axis of X, Y, and Z orthogonal to one another. These three coils receive power supply individually from the gradient magnetic field power supply 3 described later to generate a gradient magnetic field in which the magnetic field intensity changes along each axis of the X, Y, and Z. The Z axis direction is defined as the same as the direction of the static magnetic field.

The gradient magnetic field of each of the X, Y, and Z axes generated by the gradient coil 2 corresponds to, for example, a slice selection gradient magnetic field Gs, a phase encoding gradient magnetic field Ge, and a readout gradient magnetic field Gr, respectively. The slice selection gradient magnetic field Gs is used to arbitrarily determine a cross-section of imaging. The phase encoding gradient magnetic field Ge is used to alter the phase of a magnetic resonance signal in response to a spatial position. The readout gradient magnetic field Gr is used to change the frequency of the magnetic resonance signal in response to a spatial position.

The gradient magnetic field power supply 3 is a device that supplies current to the gradient coil 2 based on pulse sequence execution data sent from the computer system.

The couch 4 is a device including a couchtop 4a on which a subject S is placed, and under the control of the couch control unit 5 described later, inserts the couchtop 4a in a hollow space (an imaging opening) of the gradient coil 2 in a state in which the subject S is placed thereon. The couch 4 is normally installed such that the longitudinal direction thereof is in parallel with the central axis of the static magnetic field magnet 1.

The couch control unit 5 is a device to control the couch 4, and drives the couch 4 to move the couchtop 4a in the longitudinal direction and in the up-down direction.

The transmitting RF coil 6 is a coil disposed on an inner side of the gradient coil 2, and receives the supply of high-frequency pulses from the transmitter 7 to generate a high-frequency magnetic field.

The transmitter 7 is a device that transmits the high-frequency pulses corresponding to a Larmor frequency to the transmitting RF coil 6 based on the pulse sequence execution data sent from the computer system, and includes an oscillator, a phase selector, a frequency converter, an amplitude modulator, and a high-frequency power amplifier. The oscillator generates a high-frequency signal at a resonant frequency unique to a target atomic nucleus in the static magnetic field. The phase selector selects the phase of the high-frequency signal. The frequency converter converts the frequency of the high-frequency signal output from the phase selector. The amplitude modulator modulates the amplitude of the high-frequency signal output from the frequency converter according to, for example, a sinc function. The high-frequency power amplifier amplifies the high-frequency signal output from the amplitude modulator. As a result of the operation of each of the foregoing units, the transmitter 7 transmits the high-frequency pulses corresponding to the Larmor frequency to the transmitting RF coil 6.

The receiving RF coil 8 is a coil disposed on the inner side of the gradient coil 2, and receives a magnetic resonance signal radiated from the subject as a consequence of the above-described high-frequency magnetic field. When the receiving RF coil 8 receives a magnetic resonance signal, the receiving RF coil 8 outputs the magnetic resonance signal to the receiver 9.

The receiver 9 is a device that, based on the pulse sequence execution data sent from the computer system, generates magnetic resonance signal data based on the magnetic resonance signal output from the receiving RF coil 8. When the receiver 9 generates magnetic resonance signal data, the receiver 9 transmits the magnetic resonance signal data to the computer system 10. The receiver 9 may be included on the side of a frame device that includes the static magnetic field magnet 1 and the gradient coil 2.

The computer system 10 is a device that controls the whole magnetic resonance imaging apparatus 100 and performs data collection, image reconstruction, and others. The computer system 10 includes an interface unit 11, a data collecting unit 12, a data processing unit 13, a storage unit 14, a display unit 15, an input unit 16, and a control unit 17. The interface unit 11 is connected to the gradient magnetic field power supply 3, the couch control unit 5, the transmitter 7, and the receiver 9, and is a processor to control input and output of signals exchanged between each of the foregoing units connected and the computer system 10.

The data collecting unit 12 is a processor that collects the magnetic resonance signal data transmitted from the receiver 9 via the interface unit 11. When the data collecting unit 12 collects the magnetic resonance signal data, the data collecting unit 12 stores the magnetic resonance signal data collected in the storage unit 14.

The data processing unit 13 is a processor that performs post processing, more specifically, performs a reconstruction process such as Fourier conversion on the magnetic resonance signal data stored in the storage unit 14 to generate spectrum data or image data of a desired nuclear spin in the subject S.

The storage unit 14 is a storage unit that stores therein the magnetic resonance signal data collected by the data collecting unit 12, the image data generated by the data processing unit 13, and others for each subject S.

The display unit 15 is a device that displays, under the control of the control unit 17, various types of information such as the spectrum data or the image data. As for the display unit 15, a display device such as a liquid crystal display instrument can be used.

The input unit 16 is a device that receives various operations and information inputs from an operator. As for the input unit 16, a pointing device such as a mouse and a trackball, a selecting device such as a mode selector switch, or an input device such as a keyboard can be used appropriately.

The control unit 17 includes a central processing unit (CPU) and a memory both not depicted, and is a processor that controls the magnetic resonance imaging apparatus 100 as a whole.

A breath sensor 18 is attached to the abdomen of the subject S and detects the movement by breathing. For example, the breath sensor 18 detects the movement by breathing as air pressure, and converts the detected air pressure into an electrical signal to output as a breathing signal. The breathing signal output from the breath sensor 18 is sent to the interface unit 11 of the computer system 10, and is used for setting up the timing of pulse sequence and the detection of breathing level or respiratory cycle. The breathing level here means a depth of respiration.

A sound generator 19 generates a voice sound to instruct the subject S to breathe. For example, the sound generator 19 sends a pre-recorded voice sound saying such as "inhale" or "exhale" to a speaker 20 as an electrical signal. The speaker 20 converts the electrical signal into vibrations to output the voice sound.

In the foregoing, the overall configuration of the magnetic resonance imaging apparatus 100 in the first embodiment has been explained. Before describing the magnetic resonance imaging apparatus 100 in the first embodiment in detail, issues with a conventional magnetic resonance image apparatus will be now described.

In a conventional magnetic resonance imaging apparatus, it is common that the data necessary for image reconstruction is collected in several batches. Therefore, when a subject moves while the data is collected, the image quality may be deteriorated as the data is collected from a different location causing an artifact (a false image) and such in an image after reconstruction. Accordingly, to suppress such deterioration in image quality, imaging is often performed in synchronization with the breathing, heartbeats, or pulse waves of the subject by monitoring the foregoing.

Meanwhile, as a method to observe a condition of blood supply to blood vessels and body organs with a magnetic resonance imaging apparatus without using a contrast medium, available is an imaging method that magnetically labels spins in blood using an inversion recovery (IR) pulse and such. This imaging method is referred to as arterial spin labeling (ASL). A case of imaging a renal artery in synchronization with breathing using such a method is described in, for example, Takahashi et al., Non-Contrast-Enhanced Renal MRA using time-spatial labeling pulse (t-SLIP) with 3D balanced SSFP, book of abstract, 15th annual meeting ISMRM 2007.

In this method, an inversion recovery pulse referred to as a tag is applied to a region of interest, and after a given length of time (inversion recovery time: TI), data collection is performed by a steady-state free-precession (SSFP) method. The longitudinal magnetization of spins in a static region in the region of interest relaxes at a time constant of a T1 relaxation time of a tissue after being inverted by the inversion recovery pulse, and an absolute value of a longitudinal magnetization component after the TI time is smaller than that of when the inversion recovery pulse is not applied.

In contrast, spins of blood flowing in from the outside of the region to which the inversion recovery pulse is applied are not affected by the inversion recovery pulse, and thus retain the original longitudinal magnetization, thereby generating a high signal. To enhance the contrast between the blood vessel and a background in this method, it is important how to lower the signal of the background, more specifically, how to keep the absolute value of the longitudinal magnetization component in the static region after the TI time small.

The longitudinal magnetization component after the TI time from the inversion recovery pulse depends not only on the relaxation time T1 of the tissue and the inversion recovery time T1 but also on the longitudinal magnetization component at the time of the inversion recovery pulse being applied. The longitudinal magnetization component at that time point changes by the time from when a pulse immediately before an inversion recovery pulse is applied until the inversion recovery pulse is applied.

Figure 2:
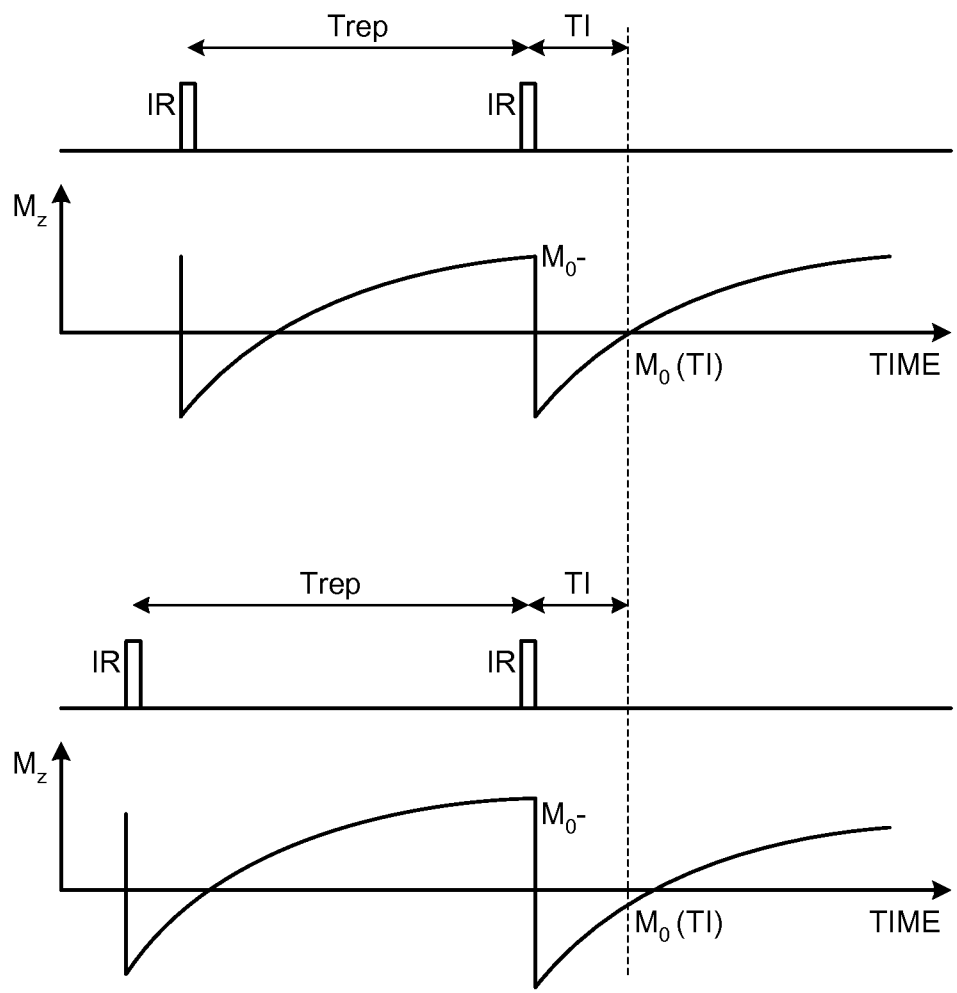
FIG. 2 is a chart illustrating changes in magnitude of longitudinal magnetization by repetition cycle of pulse sequence.

FIG. 2 is a chart illustrating the changes in magnitude of longitudinal magnetization by repetition cycle of pulse sequence. An upper part of FIG. 2 illustrates the magnitude of longitudinal magnetization in a condition in which the pulse sequence is executed at a repetition cycle Trep assumed. As illustrated in the upper part of FIG. 2, when the T1 time of the tissue is known, it is feasible to make the longitudinal magnetization component at the time of data collection closer to zero by appropriately setting the TI that is a waiting time from an inversion recovery pulse until data collection, whereby the signal of this component can be suppressed.

However, in the imaging synchronized with the breathing of a subject, for example, the interval of the pulse sequence repeated fluctuates because the respiratory cycle of the subject is not constant. For example, as illustrated in a lower part of FIG. 2, when the respiratory cycle is extended longer than the assumed time, the longitudinal magnetization component $M_0$—immediately before the second inversion recovery pulse is applied becomes a larger value as a result of the recovery towards $M_0$ taking a longer time. The absolute value $M_0$ (TI) of longitudinal magnetization at the time TI becomes larger than that in the upper part of FIG. 2. This makes the signal suppression of the static region insufficient.

To eliminate such inconveniences, available is a method in which the repetition cycle of pulse sequence is made constant as much as possible, for example, by letting the subject listen to a voice sound that guides the timing of breathing to keep the respiratory cycle constant when performing breathing-synchronous imaging (see, for example, Parienty et al., Renal Artery Stenosis Evaluation in Chronic Kidney Disease, Radiology, Volume 259, Number 2 pp 592-601, 2011). However, even with this method, it does not necessarily mean that the subject is able to breathe following the guidance of voice sound in the whole imaging period.

Figure 3A:
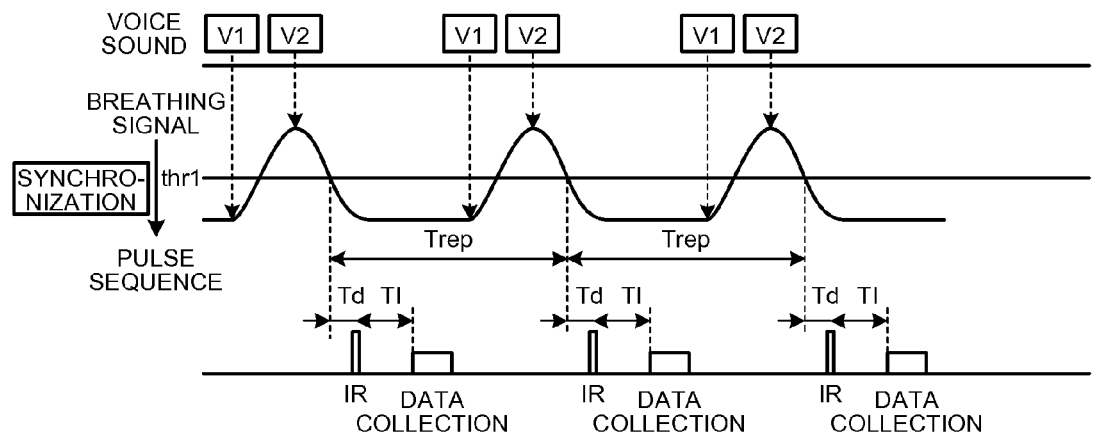
FIGS. 3A and 3B are charts illustrating an example of conventional breathing-synchronous imaging.
Figure 3B:
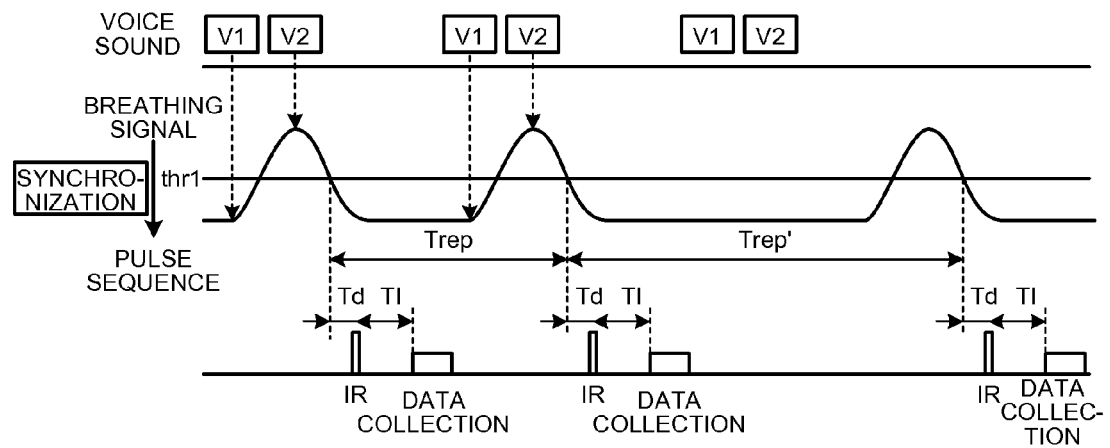

FIGS. 3A and 3B are charts illustrating an example of conventional breathing-synchronous imaging. FIG. 3A illustrates a condition in which the subject is breathing following the voice guidance represented by V1 and V2. For example, V1 represents a voice sound saying "inhale" and such, V2 represents a voice sound saying "exhale" and such, and V1 and V2 are output from the sound generator 19 and delivered to the subject via the speaker 20.

The breathing signal is a signal that represents the displacement of the abdomen of the subject detected and converted into an electrical signal by the breath sensor 18, and the pulse sequence is executed in synchronization with the signal. For example, with a time at which the breathing signal exceeds a predetermined threshold thr1 as a reference, an inversion recovery pulse IR is applied after an elapse of a given delay time Td from that time, and data collection is then performed after an elapse of the TI time. When the respiratory cycle is constant all through the imaging time, the repetition cycle Trep of pulse sequence that is executed in synchronization with the respiratory cycle also becomes constant.

However, as illustrated in FIG. 3B, when the subject becomes unable to breathe following the voice guidance in the middle of the imaging, because the imaging is synchronous with the breathing, the repetition cycle Trep' of pulse sequence fluctuates. In this case, for the reason described with reference to FIG. 2, a desired contrast, i.e., image quality cannot be achieved. In other words, even with the method that uses voice guidance, a desired contrast, i.e., image quality may not be achieved.

Meanwhile, in the magnetic resonance imaging apparatus 100 in the first embodiment, the control unit 17 executes a pulse sequence to collect data of a subject at a constant cycle, and in synchronization with that cycle, informs the subject of the timing of breathing. The control unit 17 further detects a breathing level of the subject, and when a pulse sequence is executed, determines whether to accept data collected by the pulse sequence to be used for image reconstruction in accordance with the breathing level of the subject. Accordingly, because the pulse sequence is operated at a regular interval at all times, the contrast of image can be maintained. Furthermore, accepting only the data that is within a certain range of breathing position allows reducing artifacts by respiratory body motion.

Figure 4:
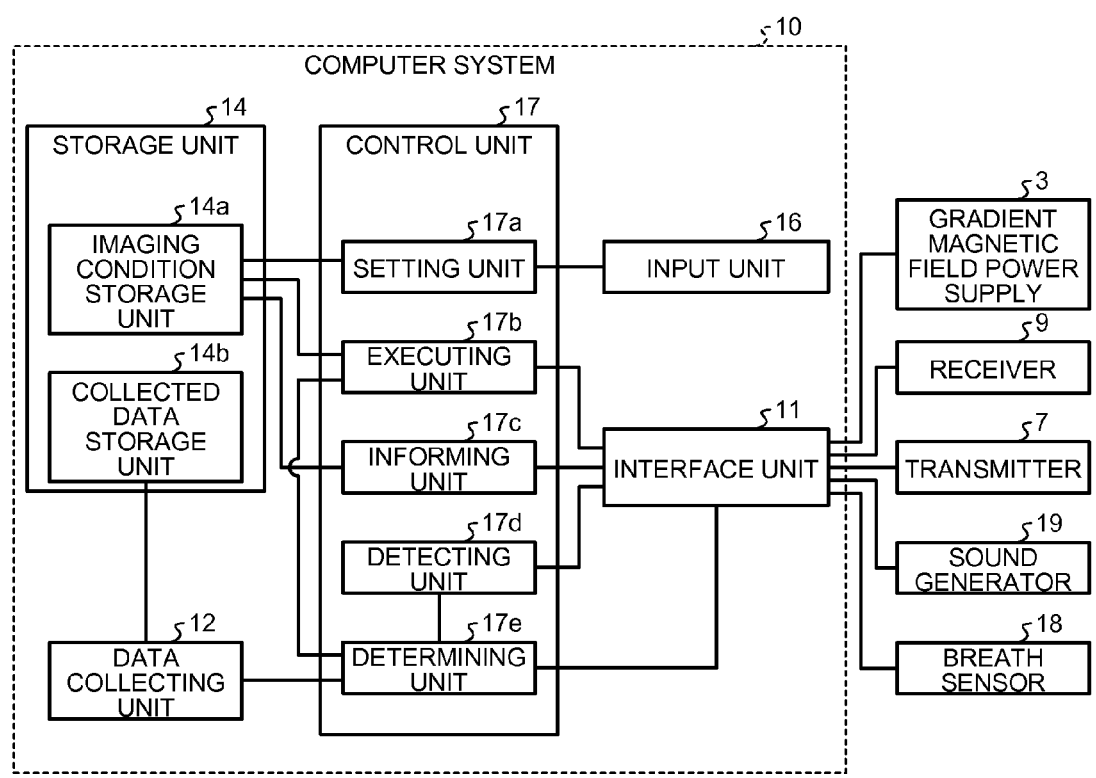
FIG. 4 is a block diagram illustrating a detailed configuration of the magnetic resonance imaging apparatus in the first embodiment.

In the following, the magnetic resonance imaging apparatus 100 will be described in detail. FIG. 4 is a block diagram illustrating a detailed configuration of the magnetic resonance imaging apparatus 100 in the first embodiment. FIG. 4 illustrates, out of the respective units illustrated in FIG. 1, the gradient magnetic field power supply 3, the transmitter 7, the receiver 9, the computer system 10, the interface unit 11, the data collecting unit 12, the storage unit 14, the input unit 16, the control unit 17, the breath sensor 18, and the sound generator 19.

As illustrated in FIG. 4, the storage unit 14 includes an imaging condition storage unit 14a and a collected data storage unit 14b.

The imaging condition storage unit 14a stores therein an imaging condition set by the operator. For example, the imaging condition storage unit 14a stores therein, as the imaging condition, a type of imaging, a type of pulse sequence, an inversion recovery time T1 that is an imaging parameter of pulse sequence, an echo time TE, a flip angle FA of excitation RF pulse, a center frequency f0 of high-frequency magnetic field, and others.

The collected data storage unit 14b stores therein magnetic resonance signal data collected by the data collecting unit 12. The magnetic resonance signal data stored in the collected data storage unit 14b is used for image reconstruction performed by the data processing unit 13.

The control unit 17 includes a setting unit 17a, an executing unit 17b, an informing unit 17c, a detecting unit 17d, and a determining unit 17e.

The setting unit 17a receives an input of imaging condition from the operator via the input unit 16, and stores the imaging condition received in the imaging condition storage unit 14a.

The executing unit 17b executes a pulse sequence to collect data of a subject at a constant repetition cycle. For example, the executing unit 17b sets up the repetition cycle based on the breathing level of the subject that is measured by performing a pre-scan before the actual scan, and executes the pulse sequence at the repetition cycle set up. As a specific example, for example, the executing unit 17b sets an average value of intervals of peaks in breathing level as the repetition cycle. The executing unit 17b, when executing a pulse sequence, generates pulse sequence execution data based on the imaging condition stored in the imaging condition storage unit 14a and sends the pulse sequence execution data to the gradient magnetic field power supply 3, the transmitter 7, and the receiver 9 so as to control the gradient magnetic field power supply 3, the transmitter 7, and the receiver 9, respectively.

The informing unit 17c informs the subject of the timing of breathing in synchronization with the cycle at which the pulse sequence is executed by the executing unit 17b. In the first embodiment, the informing unit 17c instructs the sound generator 19 to generate voice sounds in synchronization with the cycle at which the pulse sequence is executed. The informing unit 17c informing the timing of breathing in synchronization with the repetition cycle of pulse sequence can prompts the subject to breathe in time with the timing of data collection. Accordingly, the timing of data collection and the breathing can be prevented from being mismatched, whereby the number of times the data is rejected by the determining unit 17e described later can be reduced. As a consequence, the data collection is efficiently performed, whereby the imaging time can be reduced.

The detecting unit 17d detects the breathing level of the subject. In the first embodiment, the detecting unit 17d detects the breathing level of the subject based on the breathing signal output from the breath sensor 18 that is attached to the abdomen of the subject.

The determining unit 17e determines, when a pulse sequence is executed by the executing unit 17b, whether to accept the data collected by the pulse sequence to be used for image reconstruction in accordance with the breathing level of the subject. In the first embodiment, the determining unit 17e compares the breathing level of the subject with a given threshold to determine whether to accept the data collected by the pulse sequence to be used for image reconstruction. For example, the determining unit 17e sets the threshold to determine the acceptance or the rejection of data based on the breathing level of the subject that is measured by performing a pre-scan before the actual scan. As a specific example, for example, the determining unit 17e sets up a value in which a given value is added to an average value of breathing level at the time the subject breathes out completely as the threshold.

When the determining unit 17e determines to accept the data collected by the pulse sequence to be used for image reconstruction, the determining unit 17e instructs the data collecting unit 12 to store the magnetic resonance signal data collected by the pulse sequence in the collected data storage unit 14b.

On the other hand, when the determining unit 17e determines not to accept the data collected by the pulse sequence to be used for image reconstruction, the determining unit 17e rejects the magnetic resonance signal data collected by the pulse sequence. In this case, the determining unit 17e then controls the executing unit 17b to re-collect the data not accepted at a later cycle than that of the pulse sequence. For example, the determining unit 17e controls the executing unit 17b to re-collect the data at the cycle subsequent to the pulse sequence. Alternatively, the determining unit 17e may control the executing unit 17b, after the execution of a series of pulse sequences scheduled is finished, to re-collect the data not accepted by then.

Figure 5:
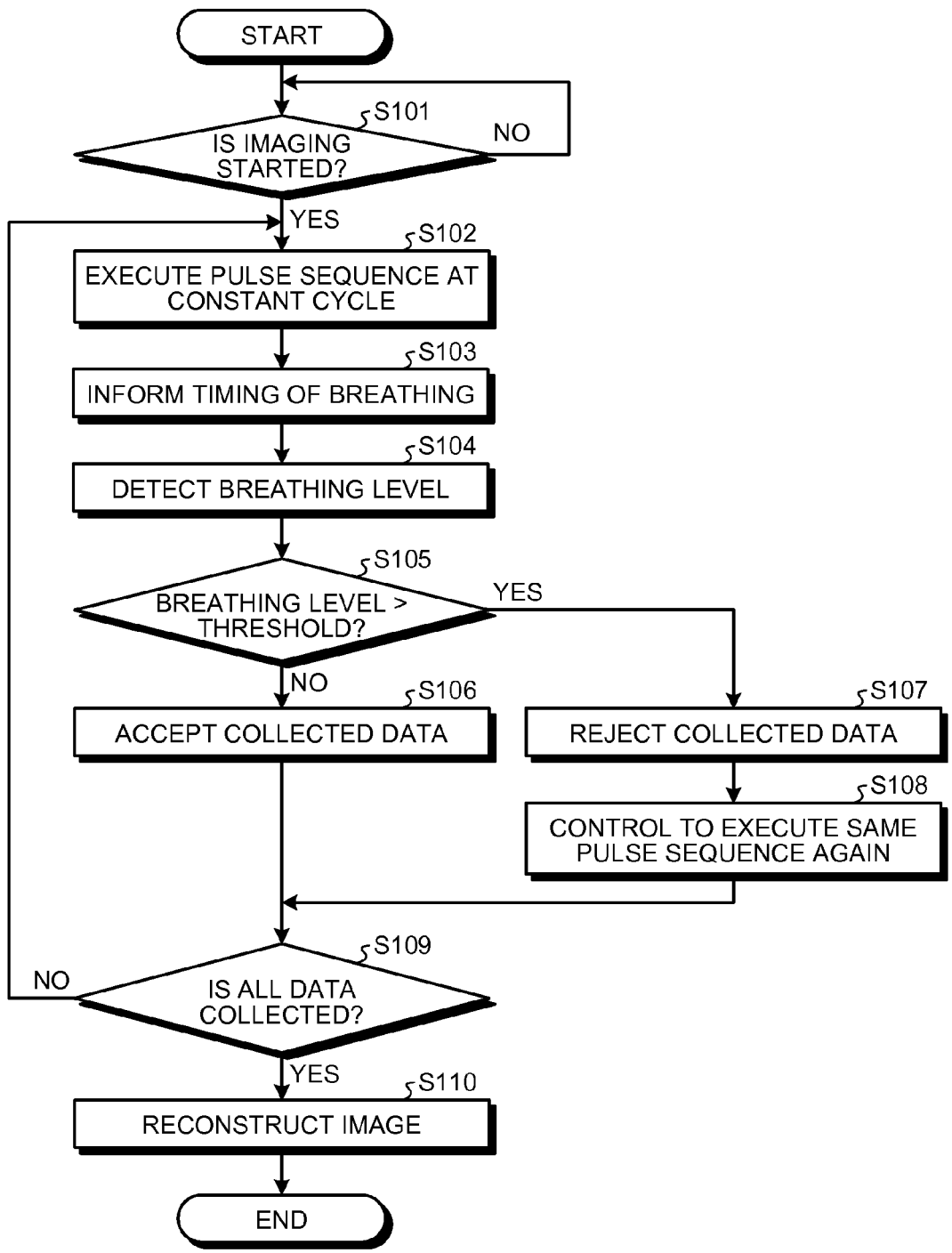
FIG. 5 is a flowchart illustrating the operation of the magnetic resonance imaging apparatus in the first embodiment.

Next, the operation of the magnetic resonance imaging apparatus 100 in the first embodiment will be described. FIG. 5 is a flowchart illustrating the operation of the magnetic resonance imaging apparatus 100 in the first embodiment. The operation after an imaging condition is set by the operator will be described here.

As illustrated in FIG. 5, in the magnetic resonance imaging apparatus 100, when the executing unit 17b receives an instruction to start imaging from an operator (Yes at S101), the executing unit 17b executes a pulse sequence to collect data of the subject at a constant repetition cycle (Step S102). In this case, the executing unit 17b starts the execution of pulse sequence after setting up the repetition cycle of pulse sequence, for example, in accordance with a type of imaging and an imaging condition (for example, a waiting time from a pre-pulse to an excitation RF pulse, and a data collection time).

The informing unit 17c then informs the subject of the timing of breathing in synchronization with the cycle at which the pulse sequence is executed by the executing unit 17b (Step S103). Thereafter, the detecting unit 17d detects a breathing level of the subject (Step S104), and the determining unit 17e determines whether the breathing level of the subject is exceeding a given threshold (Step S105).

When the breathing level of the subject is at the given threshold or less (No at S105), the determining unit 17e determines to accept the data collected by the pulse sequence to be used for image reconstruction (Step S106). In this case, the data collecting unit 12 then stores the magnetic resonance signal data collected in the collected data storage unit 14b.

In contrast, when the breathing level of the subject is exceeding the given threshold (Yes at S105), the determining unit 17e rejects the collected data (Step S107). In this case, the determining unit 17e then controls the executing unit 17b, for example, to execute the same pulse sequence again (Step S108). Accordingly, at the subsequent cycle, the collection of the data not accepted is performed again.

The executing unit 17b repeats the above-described processes at S102 to S108 until all the data is collected (No at S109). When the executing unit 17b determines that all the data is collected (Yes at S109), the data processing unit 13 performs image reconstruction based on the magnetic resonance signal data collected (Step S110).

Figure 6:
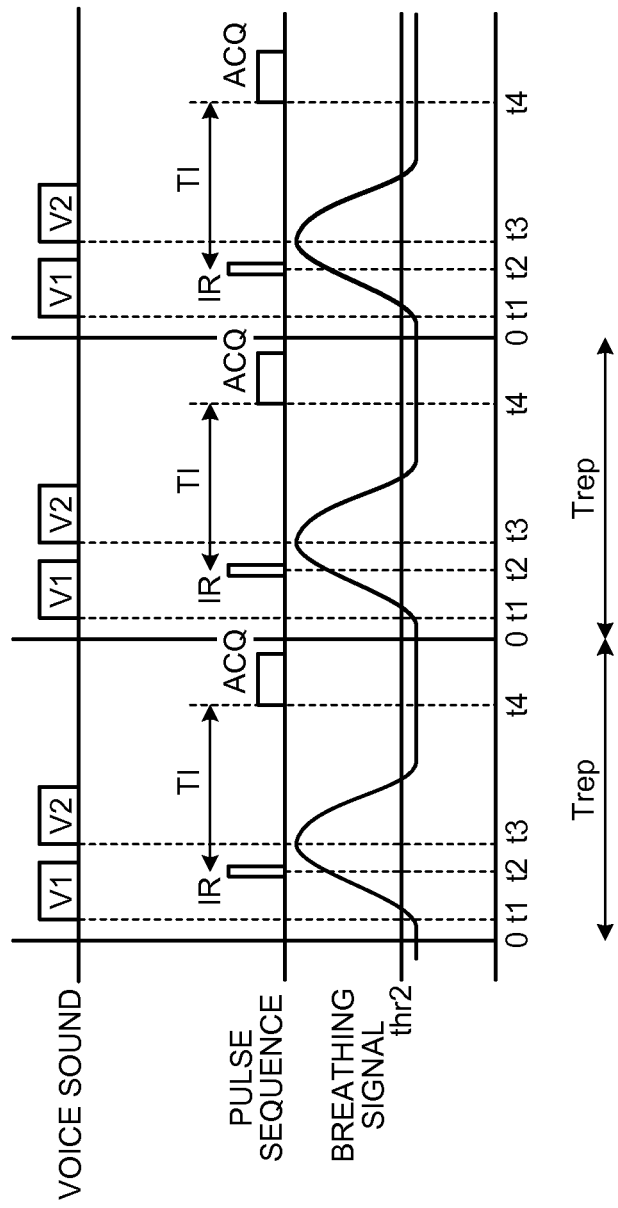
FIGS. 6 and 7 are charts illustrating an example of imaging control in the first embodiment.
Figure 7:
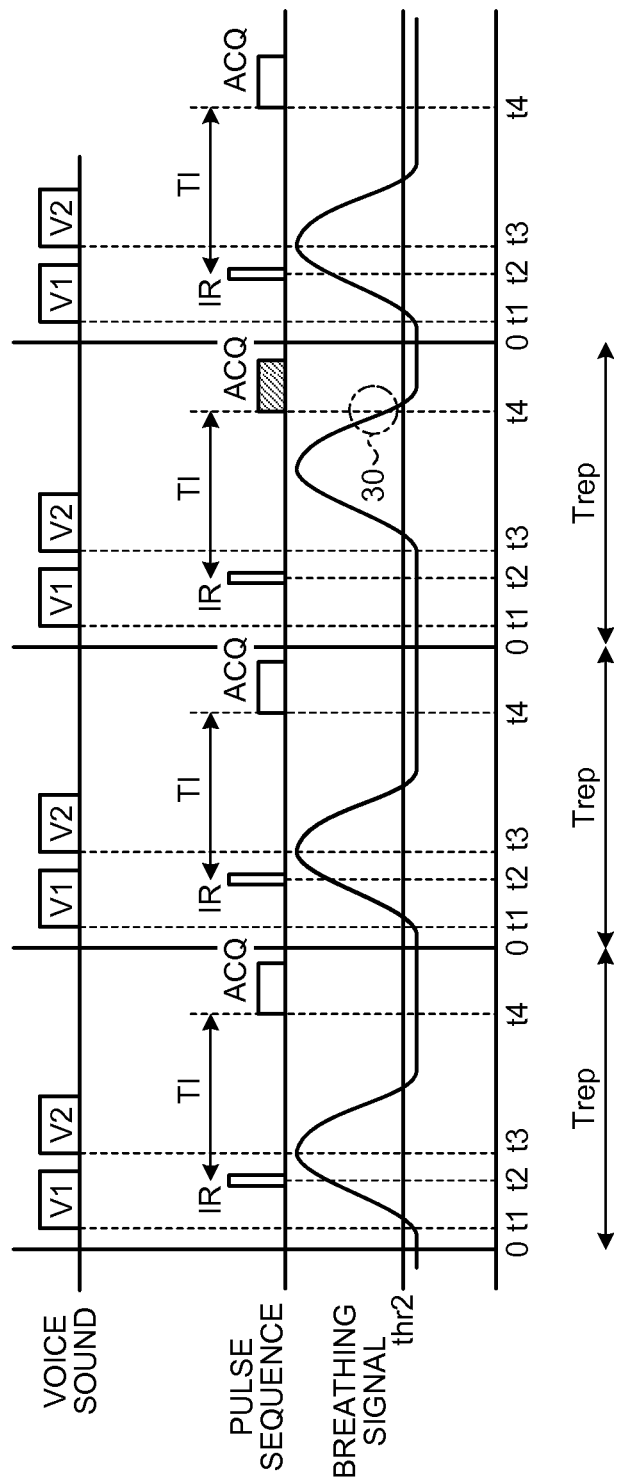

Next, an example of imaging control in the first embodiment will be described. FIGS. 6 and 7 are charts illustrating an example of imaging control in the first embodiment. Both FIGS. 6 and 7 indicate pulse sequences and voice sounds linked to the pulse sequence in chronological order, FIG. 6 illustrating an example of when the subject breathes following the voice guidance, and FIG. 7 illustrating an example of when the subject breathes not following the voice guidance.

In the first embodiment, the executing unit 17b repeatedly executes a pulse sequence at a constant repetition cycle Trep until the collection of all the data necessary for image reconstruction is completed. For example, the executing unit 17b here performs segment collection in which the data for reconstructing a single image is divided and collected by each repetition cycle Trep. For example, when a single image is reconstructed with phase encode of 256 steps and the data is divided into two segments to collect, the data is collected in two repetition cycles of 128 phase encode steps each. Alternatively, the executing unit 17b collects one slice encode (phase encode in a slice direction) in three-dimensional imaging by dividing by one, or phase encode (in a so-called phase encode direction) of a few encode steps each.

The informing unit 17c, in one repetition cycle starting at a time 0, outputs at the time represented by t1 the voice sound represented by V1, for example, a voice sound saying "inhale" to notify the subject of the timing to inhale. At a time t2, the spins in the whole imaging area or a part thereof are then inverted by an inversion recovery pulse represented by IR.

Thereafter, at a time t3, the informing unit 17c outputs the voice sound represented by V2, for example, a voice sound saying "exhale" to notify the subject of the timing to exhale. At a time t4 after the inversion recovery time T1 from the time t3, a pulse train for data collection represented by ACQ is then executed, for example, through steady-state free precession (SSFP)

The timing of voice sounds V1 and V2 and pulse sequence are stored in the storage unit 14, and the control unit 17 drives the sound generator 19, the gradient magnetic field power supply 3, the transmitter 7, and the receiver 9 via the interface unit 11 to cause the respective events.

As illustrated in FIG. 6, when the subject breathes following the voice sounds V1 and V2, the data collection ACQ matches the timing of exhalation at which the movement of abdomen is relatively small, whereby positional displacement and artifacts by the movement can be suppressed. Meanwhile, because the data collection is performed at the constant repetition cycle Trep regardless of the respiratory cycle of the subject, a certain contrast can be achieved without the occurrence of the above-described fluctuation in longitudinal magnetization.

However, during the imaging, there may be a situation in which the subject is not able to breathe following the voice guidance. For example, in the example illustrated in FIG. 7, as a result of the subject failing to breathe to the voice sound at the third cycle, the data collection represented by ACQ is performed while the subject is exhaling. In this case, at the third cycle, the signal cannot be collected from the same position as that of the data at other cycles. Consequently, an artifact occurs in the reconstructed image.

In the first embodiment, to exclude such undesirable data, the detecting unit 17d detects the breathing level of the subject during the imaging. For the detection of breathing level, for example, used is the output signal of the breath sensor 18 that is generally used for breathing-synchronous imaging. A signal such as pressure sensed by the breath sensor 18, which is attached to the subject, is converted into an electrical signal. When the signal output from the breath sensor 18 is exceeding a predetermined threshold thr2 (see inside a circle 30 depicted in FIG. 7), the determining unit 17e determines to reject the data collected at this time as being not appropriate to use for image reconstruction (the data collected by the data collecting portion ACQ with hatched lines depicted in FIG. 7) and controls to re-collect the same data at a later cycle.

For the detection of breathing level, other than to use a magnitude relation with respect to a single threshold as in the foregoing, a range defined by two thresholds may be used to further enhance the accuracy. For example, when two thresholds thr3 and thr4 (thr3>thr4) are used, the determining unit 17e rejects data when the signal output from the breath sensor 18 exceeds thr3 or falls below thr4.

Furthermore, when the determining unit 17e determines to accept data collected by a pulse sequence to be used for image reconstruction, the determining unit 17e may further control the executing unit 17b to adjust a region excited by the pulse sequence in accordance with the breathing level of the subject. Accordingly, even when a body organ for imaging is moved by breathing, the data can be collected from the same position, whereby the artifacts by the movement can be reduced.

For example, the determining unit 17e measures, using the output signal used for the detection of breathing level by the detecting unit 17d, the amount of movement of the subject from a reference position after the execution of the pulse sequence is started and immediately before the data collection is performed. The determining unit 17e then controls the executing unit 17b to adjust the region to which an excitation RF pulse is applied such that the amount of movement measured is compensated in the immediately following data collection performed within the same cycle.

As in the foregoing, in accordance with the first embodiment, the executing unit 17b executes a pulse sequence at a constant cycle, and the informing unit 17c informs the subject of the timing of breathing in synchronization with the cycle at which the pulse sequence is executed. The detecting unit 17d then detects the breathing level of the subject and the determining unit 17e determines, when the pulse sequence is executed, whether to accept the data collected by the pulse sequence to be used for image reconstruction in accordance with the breathing level of the subject. Consequently, the pulse sequence is operated at a regular interval at all times, whereby the image contrast can be maintained. Furthermore, the data that is within a certain range of breathing position only is accepted, and thus the artifacts by respiratory body motion can be reduced.

Furthermore, in accordance with the first embodiment, when the determining unit 17e determines not to accept data collected by a pulse sequence to be used for image reconstruction, the determining unit 17e controls the executing unit 17b to re-collect the data at a later cycle than that of the pulse sequence. Consequently, the data in a certain range of breathing position can be acquired for all the data necessary for image reconstruction.

Second Embodiment

In the above-described first embodiment, the detecting unit 17d is configured to detect the breathing level of the subject based on the signal output from the breath sensor 18 that is attached to the abdomen of the subject. However, for example, the detecting unit 17d may detect the breathing level of the subject using a navigator signal (also referred to as a navigator echo) that represents the movement of the subject. In the following description, an example of this case will be described as a second embodiment.

The configuration of the magnetic resonance imaging apparatus according to the second embodiment is basically the same as those illustrated in FIGS. 1 and 4. However, it differs in that the pulse sequence executed by the executing unit 17b includes a pulse train for collecting a navigator signal from an area set on the abdomen of the subject, and the detecting unit 17d detects the breathing level of the subject using the navigator signal.

In the second embodiment, for example, the executing unit 17b executes a pulse sequence that includes a pulse train for collecting a navigator signal to collect a magnetic resonance signal referred to as a navigator signal from the area set near the diaphragm of the subject. The detecting unit 17d then measures the craniocaudal displacement of the diaphragm to detect the breathing level of the subject. A method of detecting a breathing level using such a magnetic resonance signal is described in, for example, Wang et al., Navigator-Echo-based Real-Time Respiratory Gating and Triggering for Reduction of Respiration Effects in Three-dimensional Coronary MR Angiography, Radiology 1996, 198:55-60.

Figure 8:
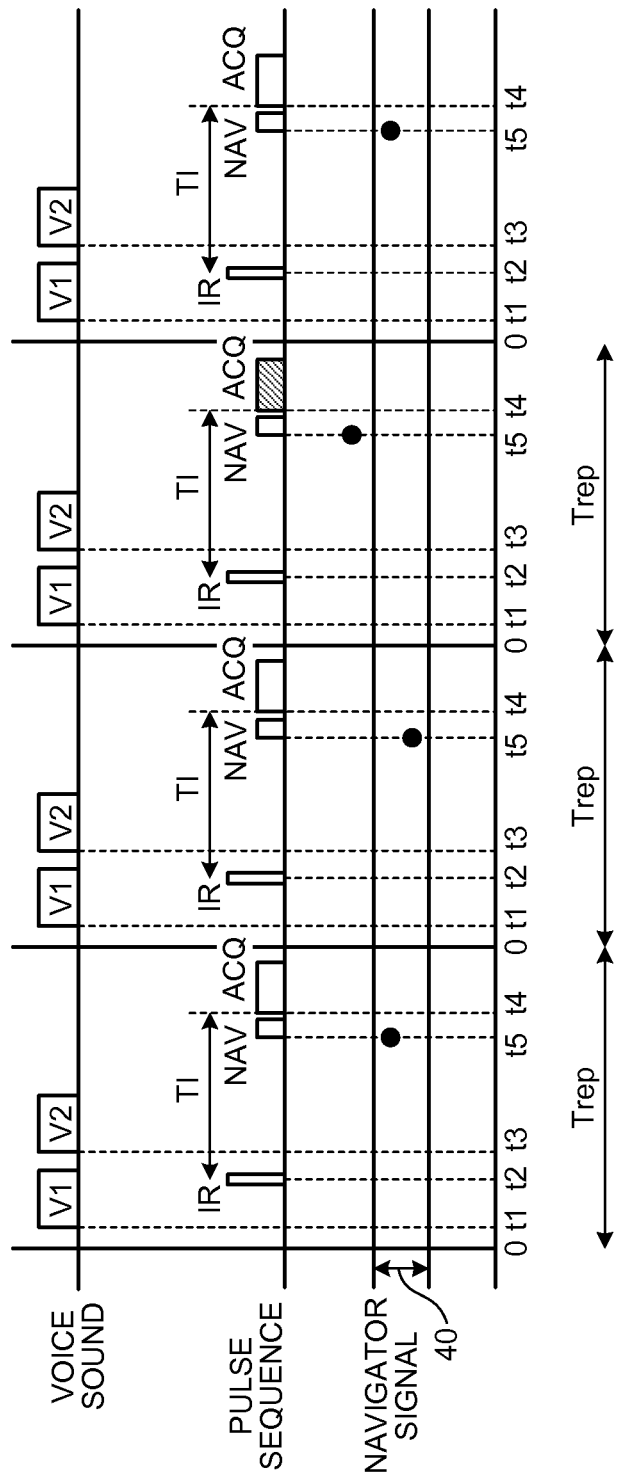
FIG. 8 is a chart illustrating an example of imaging control according to a second embodiment.

FIG. 8 is a chart illustrating an example of imaging control in the second embodiment. FIG. 8 indicates pulse sequences and voice sounds linked to the pulse sequence in chronological order, and illustrates an example of when the subject breathes not following the voice guidance.

Also in the second embodiment, the executing unit 17b repeatedly executes a pulse sequence at a constant repetition cycle Trep until the collection of all the data necessary for image reconstruction is completed. In the second embodiment, as illustrated in FIG. 8, in the pulse sequence, a navigator signal collecting portion represented by NAV is inserted at a time t5 before the time t4 at which the data collection is started. The navigator signal collecting portion is a pulse train for collecting a navigator signal from the area set on the abdomen of the subject.

In the second embodiment, the detecting unit 17d detects the border between a liver and lungs from the navigator signal collected by the navigator signal collecting portion to find the displacement of a diaphragm (positions of black dots depicted in FIG. 8). When the displacement found by the detecting unit 17d is within a preset range (the range indicated by a two-way arrow 40 in FIG. 8), the determining unit 17e accepts the collected data, and when the displacement is not within the preset range, the determining unit 17e rejects the collected data.

For example, in the example illustrated in FIG. 8, the displacement found from the navigator signal at the first, the second, and the fourth cycles are within the preset range, while the displacement found from the navigator signal at the third cycle is not within the range. Accordingly, in the example illustrated in FIG. 8, the respective data collected at the first, the second, and the fourth cycles are accepted and the data collected at the third cycle (the data collected by the data collecting portion ACQ with hatched lines depicted in FIG. 8) is rejected.

When the determining unit 17e determines not to accept the data, the determining unit 17e controls the executing unit 17b, similarly to that in the first embodiment, to re-collect the data not accepted at a later cycle than that of the pulse sequence. For example, the determining unit 17e controls the executing unit 17b to re-collect the data at the subsequent cycle of the pulse sequence. Alternatively, the determining unit 17e may control the executing unit 17b, after the execution of a series of pulse sequences scheduled is finished, to re-collect the data not accepted by then.

Furthermore, when the determining unit 17e determines to accept data collected by a pulse sequence to be used for image reconstruction, the determining unit 17e may further control the executing unit 17b to adjust a region excited by the pulse sequence in accordance with the amount of displacement of the diaphragm. Accordingly, even when a body organ for imaging is moved by breathing, the data can be collected from the same position, whereby the artifacts by the movement can be reduced.

For example, the determining unit 17e measures the amount of movement of diaphragm from a reference position using the navigator signal used for the detection of breathing level by the detecting unit 17d. The determining unit 17e then controls the executing unit 17b to adjust the region to which an excitation RF pulse is applied such that the amount of movement measured is compensated in the immediately following data collection performed within the same cycle.

As in the foregoing, in accordance with the second embodiment, the pulse sequence executed by the executing unit 17b includes a pulse train for collecting a navigator signal from the area set on the abdomen of the subject. The detecting unit 17d then detects the breathing level of the subject using the navigator signal collected. Accordingly, the breathing level of the subject can be detected without using the breath sensor 18, whereby the cost of the apparatus can be reduced.

In the above-described embodiments, the executing unit 17b is configured to set up the repetition cycle of pulse sequence based on the breathing level of the subject measured by performing a pre-scan before the actual scan. However, for example, the executing unit 17b may set up the cycle to execute the pulse sequence according to the imaging condition set by the operator.

For example, as illustrated in the embodiments, in an imaging method that visualizes flowing blood by suppressing a signal from a static region by an inversion recovery pulse, a reaching distance of blood flowing in from outside of the region during the waiting time TI, which is from an inversion recovery pulse until the data collection, changes by the blood flow velocity of the subject, whereby the range of blood vessel visualized is changed. Therefore, the TI may be adjusted by estimating the blood flow velocity of the subject from the heart rate or other information. In this case, the executing unit 17b sets up the repetition cycle of pulse sequence based on the adjusted TI so that the signal from the static region is suppressed.

Furthermore, for example, when the type of imaging set as an imaging condition is myocardial delayed enhancement imaging, the executing unit 17b sets the repetition cycle of pulse sequence based on the TI. The myocardial delayed enhancement imaging is an imaging method to visualize a myocardial infarction region and such as high signal by injecting a contrast medium having an effect of shortening the T1 relaxation time into the subject, and by imaging a T1-weighted image of the heart, for example, 15 to 20 minutes later. In such myocardial delayed enhancement imaging, the TI is the time from when an inversion recovery pulse is applied until the signal strength of a healthy cardiac muscle becomes nearly zero.

Moreover, for example, when the type of imaging set as an imaging condition is non-enhanced angiography (MR angiography: MRA), the executing unit 17b sets up the repetition cycle of pulse sequence based on a black blood inversion time (BBTI). The non-enhanced MRA is an imaging method to image blood flow behavior in an imaging area by applying an inversion recovery pulse to a given region in the imaging area to label the region, and by subsequently detecting the blood flow flowing out from the labeled region. In such non-enhanced MRA, the BBTI represents the time from when an inversion recovery pulse is applied until imaging is started.

Generally, an imaging cycle (repetition cycle of pulse sequence) includes from a pre-pulse to a divided collection period or a voice sound to a divided collection period, and is determined by the type of imaging and the imaging condition. For example, in imaging in which a part of an imaging area or a labeling region upstream is tagged by an inversion recovery pulse or a saturation pulse and the imaging is performed during a waiting time (TI with inversion recovery pulse), a moving distance of fluid changes by the waiting time. In such imaging, the waiting time has a profound effect on the imaging cycle. Even in other imaging in which an inversion recovery pulse is applied to the whole imaging area and the imaging is performed after the TI, the waiting has a profound effect on the imaging cycle.

In the above-described embodiments, the determining unit 17e is configured to set the threshold to determine the acceptance or the rejection of data based on the breathing level of the subject measured by performing a pre-scan before the actual scan. However, for example, the determining unit 17e may change the threshold to determine the acceptance or the rejection of data in accordance with the changes in the breathing level of the subject.

The threshold used here is determined by, for example, a breath-holding practice before the actual imaging. However, for example, when the subject falls asleep, the breathing level becomes shallow and may fall outside of the threshold range. In such a situation, all the data subsequent to certain data collection becomes rejected and the imaging is never completed. Therefore, for example, the threshold range is made to follow (adjusted) according to the changes in the breathing level. For example, when the breathing level consecutively falls outside the threshold range for a given number of times, the threshold range is changed such that the breathing level at that time falls within the range.

For example, when the breathing level of the subject gradually becomes shallow or gradually becomes deep, it is desirable that the threshold be changed accordingly. Therefore, for example, when the breathing level at the time of the subject breathing out completely is successively increased for a given number of cycles, the determining unit 17e increases the threshold by a given value. On the other hand, when the breathing level at the time of the subject breathing out completely is successively decreased for a given number of cycles, the determining unit 17e decreases the threshold by a given value. The threshold in this case, for example, is initially set by the operator before imaging.

Furthermore, in the above-described embodiments, the informing unit 17c is configured to instruct the sound generator 19 to sound the voice sound so as to inform the subject of the timing of breathing. However, the informing unit 17c may inform the subject of the timing of breathing by the information other than the voice sound. For example, the informing unit 17c may output an image that indicates the timing of breathing on a monitor that is visible to the subject. As a specific example, the informing unit 17c indicates the timings of exhalation and inhalation by a wavy curve line, and outputs the curve line to the monitor dynamically.

In the above-described embodiments, the executing unit 17b is configured to set up the repetition cycle of pulse sequence based on the breathing level and the imaging condition. Specifically, the executing unit 17b sets the repetition cycle with reference to a clock of the magnetic resonance imaging apparatus 100. For example, the executing unit 17b sets the timing of the clock being operated for a given number of times as the time 0 depicted in FIGS. 6 to 8, and sets the length of repetition cycle by changing the given number of times.

In the above-described embodiments, the determining unit 17e is configured to compare the breathing level of the subject with a given threshold to determine the acceptance or the rejection of data. However, the embodiments are not limited to this. To determine whether the data is collected in a time slot at which the respiratory condition is stable, it may be detected whether the respiratory cycle, but not the breathing level, is within a given threshold range. Accordingly, for example, the determining unit 17e may compare the respiratory cycle of the subject with a given threshold to determine the acceptance or the rejection of data.

When the respiratory cycle is used in the first embodiment, the determining unit 17e, for example, detects peaks in the breathing signal immediately before the data collection period, and determines whether the time between the detected peaks (for example, between two peaks) is within a given threshold range to determine the acceptance or the rejection of data. Meanwhile, when the respiratory cycle is used in the second embodiment, the determining unit 17e, for example, increases the number of navigator signals to collect in a single cycle, and collects a plurality of navigator signals for each cycle. The determining unit 17e then performs spline interpolation on the navigator signals collected to detect the peaks of changes in the navigator signals for each cycle, and determines whether the time between the detected peaks (for example, between two peaks) is within a given threshold range to determine the acceptance or the rejection of data.

The determining unit 17e may perform the determination of threshold using only the breathing level or may perform the determination of threshold using only the respiratory cycle. Furthermore, the determining unit 17e may perform the determination of threshold using both the breathing level and the respiratory cycle.

In the above-described embodiments, the examples of performing the data collection that involves a single inversion recovery pre-pulse have been illustrated. However, the embodiments are not limited to this. For example, the embodiments are applicable when a plurality of pre-pulses are involved, when a pre-pulse of other than the inversion recovery pulse such as fat suppression is involved, or when a pulse sequence with a plurality of types of the forgoing pre-pulses combined are executed. Moreover, regardless of the presence of pre-pulse, the embodiments are effective in imaging in which the repetition cycle of pulse sequence needs to be kept constant.

In accordance with the data collecting method in the above-described embodiments, it is feasible to image various types of imaging regions by the present imaging. However, it is particularly useful when imaging an abdomen which requires the data to be collected in synchronization with breathing. More particularly, it is useful when imaging a kidney by non-enhanced MRA. It is because the kidney is desirable to be inspected without using a contrast medium and its amount of movement by breathing is large.

In the above-described embodiments, the examples of determining whether to accept the data collected by the pulse sequence to be used for image reconstruction in accordance with the breathing level or the respiratory cycle of the subject have been illustrated. However, the embodiments are not limited to this. For example, in accordance with the breathing level or the respiratory cycle of the subject, it may be determined whether to perform the data collection by the pulse sequence.

In this case, for example, when a pulse sequence is executed, the determining unit 17e determines whether to perform the data collection by the pulse sequence in accordance with the breathing level or the respiratory cycle of the subject. Specifically, the determining unit 17e compares the breathing level of the subject with a given threshold in the same manner as in the foregoing embodiments to determine whether to perform the data collection by the pulse sequence. The method to set the threshold is the same as those in the above-described embodiments.

When the determining unit 17e determines not to perform the data collection by the pulse sequence, the determining unit 17e then controls the receiver 9 that processes a magnetic resonance signal received by the RF coil not to perform sampling to digitize the magnetic resonance signal collected by the pulse sequence. The sampling here is an A/D conversion process to generate magnetic resonance signal data of digital signal from a magnetic resonance signal of analog signal. In contrast, when the determining unit 17e determines to perform the data collection by the pulse sequence, the determining unit 17e controls the receiver 9 to perform sampling to digitize the magnetic resonance signal collected by the pulse sequence.

When the determining unit 17e determines not to perform the data collection by the pulse sequence, the determining unit 17e controls the receiver 9 not to perform sampling and controls the executing unit 17b to apply an excitation RF pulse in the pulse sequence. In this case, the executing unit 17b, for example, generates pulse sequence execution data to only apply the excitation RF pulse included in the pulse sequence, and sends the pulse sequence execution data generated to the transmitter 7.

Accordingly, even when the determining unit 17e determines not to perform the data collection by the pulse sequence, the excitation RF pulse is applied not stopping the execution of the pulse sequence itself, thereby preventing the displacement of longitudinal magnetization that may arise in the magnetic resonance signal collected by the subsequent pulse sequence when the execution of the pulse sequence itself is stopped.

Alternatively, when the determining unit 17e determines not to perform the data collection by the pulse sequence, the determining unit 17e may control the receiver 9 not to perform sampling and may control the executing unit 17b to apply the excitation RF pulse and a gradient magnetic field in the same manner as when the determining unit 17e determines to perform the data collection by the pulse sequence. In this case, for example, the executing unit 17b generates pulse sequence execution data to apply only the excitation RF pulse and the gradient magnetic field included in the pulse sequence, and then sends the pulse sequence execution data generated to the gradient magnetic field power supply 3 and the transmitter 7.

Accordingly, even when the determining unit 17e determines not to perform the data collection by the pulse sequence, the excitation RF pulse is applied not stopping the execution of the pulse sequence itself, thereby preventing the displacement of longitudinal magnetization and that of transverse magnetization that may arise in the magnetic resonance signal collected by the subsequent pulse sequence when the execution of the pulse sequence itself is stopped.

As a method to control the sampling by the receiver 9, the determining unit 17e may expressly instruct the receiver 9 to perform sampling and not to perform sampling, or may only instruct the receiver 9 not to perform sampling. More specifically, when the receiver 9 is configured to perform sampling as a prescribed operation unless otherwise the receiver 9 is expressly instructed by the determining unit 17e, the determining unit 17e may give instructions to the receiver 9 not to perform sampling only when controlling the receiver 9 not to perform sampling, and may not give instructions when controlling the receiver 9 to perform sampling.

The magnetic resonance imaging apparatus in at least one of the above-described embodiments allows reducing artifacts by the respiratory movement while maintaining the image contrast.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic resonance imaging apparatus comprising:
    an executing unit configured to execute a pulse sequence to collect data of a subject at a constant cycle;
    an informing unit configured to inform the subject of a timing of breathing in synchronization with the cycle at which the pulse sequence is executed;
    a detecting unit configured to detect a breathing level or a respiratory cycle of the subject; and
    a determining unit configured to determine, when the pulse sequence is executed, whether to use the data collected by the pulse sequence for image reconstruction in accordance with the breathing level or the respiratory cycle of the subject.

2. The magnetic resonance imaging apparatus according to claim 1, wherein the executing unit is configured to set up the cycle to execute the pulse sequence in accordance with an imaging condition set by an operator.

3. The magnetic resonance imaging apparatus according to claim 2, wherein the determining unit is configured to control the executing unit, when the determining unit determines not to use the data collected by the pulse sequence for image reconstruction, to re-collect the data at a later cycle than that of the pulse sequence.

4. The magnetic resonance imaging apparatus according to claim 1, wherein the determining unit is configured to control the executing unit, when the determining unit determines not to use the data collected by the pulse sequence for image reconstruction, to re-collect the data at a later cycle than that of the pulse sequence.

5. The magnetic resonance imaging apparatus according to claim 1, wherein the determining unit is configured to control the executing unit, when the determining unit determines to use the data collected by the pulse sequence for image reconstruction, to adjust a region excited by the pulse sequence in accordance with the breathing level or the respiratory cycle of the subject.

6. The magnetic resonance imaging apparatus according to claim 1, wherein the detecting unit is configured to detect the breathing level or the respiratory cycle of the subject based on a signal output from a breath sensor attached to the abdomen of the subject.

7. The magnetic resonance imaging apparatus according to claim 1, wherein
    the pulse sequence executed by the executing unit includes a pulse train for collecting a navigator signal representing a movement of the subject from an area set on the abdomen of the subject, and
    the detecting unit is configured to detect the breathing level or the respiratory cycle of the subject using the navigator signal.

8. The magnetic resonance imaging apparatus according to claim 1, wherein the determining unit is configured to compare the breathing level or the respiratory cycle of the subject with a given threshold to determine whether to use the data collected by the pulse sequence for image reconstruction.

9. The magnetic resonance imaging apparatus according to claim 8, wherein the determining unit is configured to change the threshold in accordance with changes in the breathing level or the respiratory cycle of the subject.

10. A magnetic resonance imaging apparatus comprising:
    an executing unit configured to execute a pulse sequence to collect data of a subject at a constant cycle;
    an informing unit configured to inform the subject of a timing of breathing in synchronization with the cycle at which the pulse sequence is executed;
    a detecting unit configured to detect a breathing level or a respiratory cycle of the subject; and
    a determining unit configured to determine, when the pulse sequence is executed, whether to perform data collection by the pulse sequence in accordance with the breathing level or the respiratory cycle of the subject.

11. The magnetic resonance imaging apparatus according to claim 10, wherein the determining unit is configured, when the determining unit determines not to perform the data collection by the pulse sequence, to control a receiver that processes a magnetic resonance signal received by an RF coil not to perform sampling to digitize a magnetic resonance signal collected by the pulse sequence.

12. The magnetic resonance imaging apparatus according to claim 11, wherein the determining unit is configured, when the determining unit determines not to perform the data collection by the pulse sequence, to control the receiver not to perform the sampling and to control the executing unit to apply an excitation RF pulse in the pulse sequence.

13. The magnetic resonance imaging apparatus according to claim 11, wherein the determining unit is configured, when the determining unit determines not to perform the data collection by the pulse sequence, to control the receiver not to perform the sampling and to control the executing unit to apply an excitation RF pulse and a gradient magnetic field in the same manner as when the determining unit determines to perform the data collection by the pulse sequence.

14. The magnetic resonance imaging apparatus according to claim 10, wherein the executing unit is configured to set up the cycle to execute the pulse sequence in accordance with an imaging condition set by an operator.

15. The magnetic resonance imaging apparatus according to claim 10, wherein the determining unit is configured, when the determining unit determines not to perform the data collection by the pulse sequence, to control the executing unit to re-collect the data at a later cycle than that of the pulse sequence.

16. The magnetic resonance imaging apparatus according to claim 10, wherein the determining unit is configured, when the determining unit determines to perform the data collection by the pulse sequence, to control the executing unit to adjust a region excited by the pulse sequence in accordance with the breathing level or the respiratory cycle of the subject.

17. The magnetic resonance imaging apparatus according to claim 10, wherein the detecting unit is configured to detect the breathing level or the respiratory cycle of the subject based on a signal output from a breath sensor attached to the abdomen of the subject.

18. The magnetic resonance imaging apparatus according to claim 10, wherein the pulse sequence executed by the executing unit includes a pulse train for collecting a navigator signal representing a movement of the subject from an area set on the abdomen of the subject, and the detecting unit is configured to detect the breathing level or the respiratory cycle of the subject using the navigator signal.

19. The magnetic resonance imaging apparatus according to claim 10, wherein the determining unit is configured to compare the breathing level or the respiratory cycle of the subject with a given threshold to determine whether to use the data collected by the pulse sequence for image reconstruction.

20. The magnetic resonance imaging apparatus according to claim 19, wherein the determining unit is configured to change the threshold in accordance with changes in the breathing level or the respiratory cycle of the subject.

* * * * *